United States Patent [19]

Wu et al.

[11] Patent Number: 5,486,794
[45] Date of Patent: Jan. 23, 1996

[54] VARIABLE FREQUENCY LC OSCILLATOR USING VARIABLE IMPEDANCE AND NEGATIVE IMPEDANCE CIRCUITS

[75] Inventors: Jieh-Tsong Wu, Taipei; Wei-Zen Shen, Tou-Liu, both of Taiwan

[73] Assignee: National Science Council of R.O.C., Taipei, Taiwan

[21] Appl. No.: 356,861

[22] Filed: Dec. 15, 1994

[51] Int. Cl.$^6$ .............................. H03B 5/12; H03B 7/06
[52] U.S. Cl. ................... 331/115; 331/117 R; 331/167; 331/177 R
[58] Field of Search .............................. 331/115, 117 R, 331/117 FE, 167, 177 R, 132

[56] References Cited

U.S. PATENT DOCUMENTS

| | | | |
|---|---|---|---|
| 4,234,858 | 11/1980 | Gomi | 331/117 R |
| 4,243,953 | 1/1981 | Balaban et al. | 331/117 R |
| 4,801,898 | 1/1989 | Obayashi | 331/132 |

*Primary Examiner*—Siegfried H. Grimm
*Attorney, Agent, or Firm*—Morgan & Finnegan

[57] ABSTRACT

A variable frequency oscillator which can be implemented entirely in a semiconductor chip, which is variable over a broad frequency range and which has relatively low phase noise, includes a variable impedance circuit, a reactive load connected to an output terminal pair of the variable impedance circuit, and a negative impedance circuit having an output terminal pair connected to the output terminal pair of the variable impedance circuit. In one embodiment, the negative impedance circuit has an input terminal pair connected to an input terminal pair of the variable impedance circuit to serve as a positive feedback path for the variable impedance circuit. In another embodiment, the negative impedance circuit includes a pair of level shifters which ensure that the variable impedance circuit is properly biased and works in a forward active region.

15 Claims, 5 Drawing Sheets

VARIABLE FREQUENCY LC OSCILLATOR USING VARIABLE IMPEDANCE AND NEGATIVE IMPEDANCE CIRCUITS

BACKGROUND OF THE INVENTION

1. Field of the Invention

The invention relates to a variable frequency oscillator, more particularly to a variable frequency oscillator which can be implemented entirely in a semiconductor chip, which is variable over a broad frequency range and which has relatively low phase noise.

2. Description of the Related Art

Variable frequency oscillators can be classified as tuned oscillators or as relaxation oscillators. Tuned oscillators employ LC-tank circuits or crystals and are known to be operable and stable at high frequencies and are also known to have relatively low phase noise. However, frequency adjustment of conventional tuned oscillators is usually limited to a very narrow range. In addition, conventional tuned oscillators require expensive and bulky external circuitry, such as varactors. Thus, conventional tuned oscillators are seldom used in integrated circuits.

Relaxation oscillators, on the other hand, can be implemented in semiconductor chips as monolithic integrated circuits. Although relaxation oscillators permit frequency adjustment over a broad range, they have relatively poor frequency stability and generate excessive phase noise due to their use of a Schmitt trigger to actuate a timing control unit.

SUMMARY OF THE INVENTION

Therefore, the object of the present invention is to provide a variable frequency oscillator which has the advantages of both tuned and relaxation oscillators.

More specifically, the object of the present invention is to provide a variable frequency oscillator which can be implemented entirely in a semiconductor chip, which is variable over a broad frequency range and which has relatively low phase noise.

In one aspect of the present invention, a variable frequency oscillator comprises: a variable impedance circuit having an input terminal pair, an output terminal pair and a control input pair for receiving a control voltage to vary impedance of the variable impedance circuit; a reactive load connected to the output terminal pair of the variable impedance circuit, the variable impedance circuit being a capacitive impedance when the reactive load is an inductive load and being an inductive impedance when the reactive load is a capacitive load; and a negative impedance circuit having an output terminal pair connected to the output terminal pair of the variable impedance circuit and an input terminal pair connected to the input terminal pair of the variable impedance circuit, the negative impedance circuit serving as a positive feedback path for the variable impedance circuit.

The negative impedance circuit comprises a pair of first transistors with a pair of collectors that serve as the output terminal pair of the negative impedance circuit, and a pair of emitters that serve as the input terminal pair of the negative impedance circuit. Each of the first transistors further has a base connected to the collector of the other one of the first transistors. The negative impedance circuit further comprises a resistive load connected between the pair of emitters of the first transistor pair.

The variable impedance circuit comprises: a differential circuit including a transistor pair with a pair of input terminals that serve as the input terminal pair of the variable impedance circuit, a pair of output terminals, and a pair of emitters; a reactive element connected between the emitters of the transistor pair of the differential circuit, the reactive element being a capacitive element when the reactive load is an inductive load and being an inductive element when the reactive load is a capacitive load; and a variable current attenuator having a pair of input terminals connected respectively to the output terminals of the transistor pair of the differential circuit, a pair of output terminals that serve as the output terminal pair of the variable impedance circuit, and the control input pair for receiving the control voltage to vary current gain of the variable current attenuator to vary an impedance measured across the output terminals of the variable current attenuator.

In another aspect of the present invention, the variable impedance circuit of a variable frequency oscillator includes: a first differential circuit having a transistor pair with a pair of input terminals, a pair of output terminals, and a pair of emitters; a reactive element connected between the emitters of the transistor pair; a first variable current attenuator having a pair of input terminals connected respectively to the output terminals of the transistor pair, a pair of output terminals, and a control input pair for receiving a first control voltage to vary current gain of the first variable current attenuator to vary correspondingly an impedance measured across the output terminals of the first variable current attenuator; and a pair of level shifters, each of which having an input terminal connected to a respective one of the output terminals of the variable current attenuator, and an output terminal connected to a respective one of the input terminals of the transistor pair, the level shifters ensuring that the first differential circuit and the first variable current attenuator are properly biased and are working in a forward active region.

A reactive load is connected to the output terminals of the first variable current attenuator, and a negative impedance circuit has an output terminal pair connected to the output terminals of the first variable current attenuator.

In one embodiment, the negative impedance circuit comprises: a second differential circuit having a transistor pair with a pair of input terminals, a pair of output terminals, and a pair of emitters; a resistive element connected between the emitters of the transistor pair of the second differential circuit; a second variable current attenuator having a pair of input terminals connected respectively to the output terminals of the transistor pair of the second differential circuit, a pair of output terminals serving as the output terminal pair of the negative impedance circuit, and a control input pair for receiving a second control voltage to vary impedance of the negative impedance circuit; and a pair of level shifters, each of which having an input terminal connected to a respective one of the output terminals of the second variable current attenuator, and an output terminal connected to a respective one of the input terminals of the transistor pair of the second differential circuit.

In another embodiment, the negative impedance circuit further has an input terminal pair connected to the input terminals of the first differential circuit, and comprises: a second differential circuit having a transistor pair with a pair of input terminals connected to the input terminals of the transistor pair of the first differential circuit, a pair of output terminals, and a pair of emitters; a resistive element connected between the emitters of the transistor pair of the second differential circuit; and a second variable current attenuator having a pair of input terminals connected respectively to the output terminals of the transistor pair of the second differential circuit, a pair of output terminals serving as the output terminal pair of the negative impedance circuit, and a control input pair for receiving a second control voltage to vary impedance of the negative impedance circuit.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
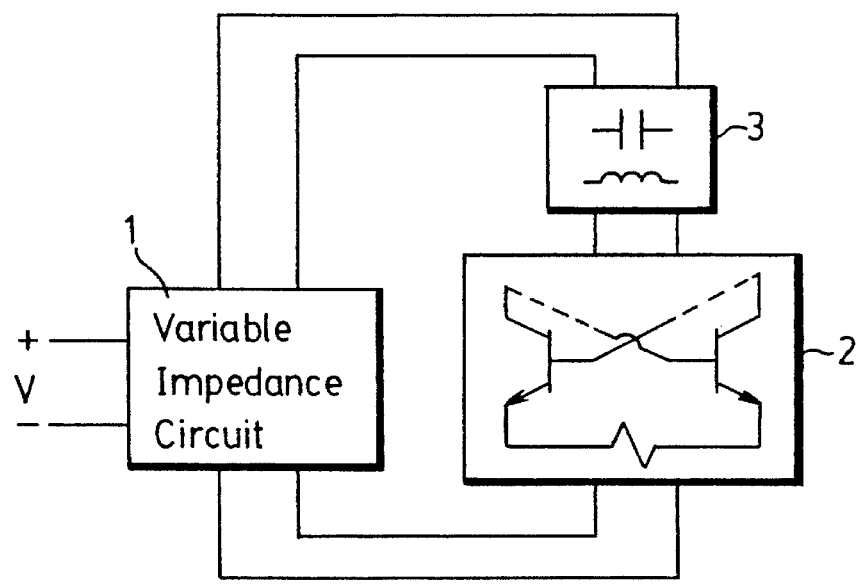
FIG. 1 is a schematic circuit block diagram of the first preferred embodiment of a variable frequency oscillator according to the present invention.

Before the present invention is described in greater detail, it should be noted that like elements are denoted by the same reference numerals throughout the disclosure.

Referring to FIG. 1, the first preferred embodiment of a variable frequency oscillator according to the present invention is shown to comprise a variable impedance circuit 1, a negative impedance circuit 2, and a reactive load 3.

Figure 2:
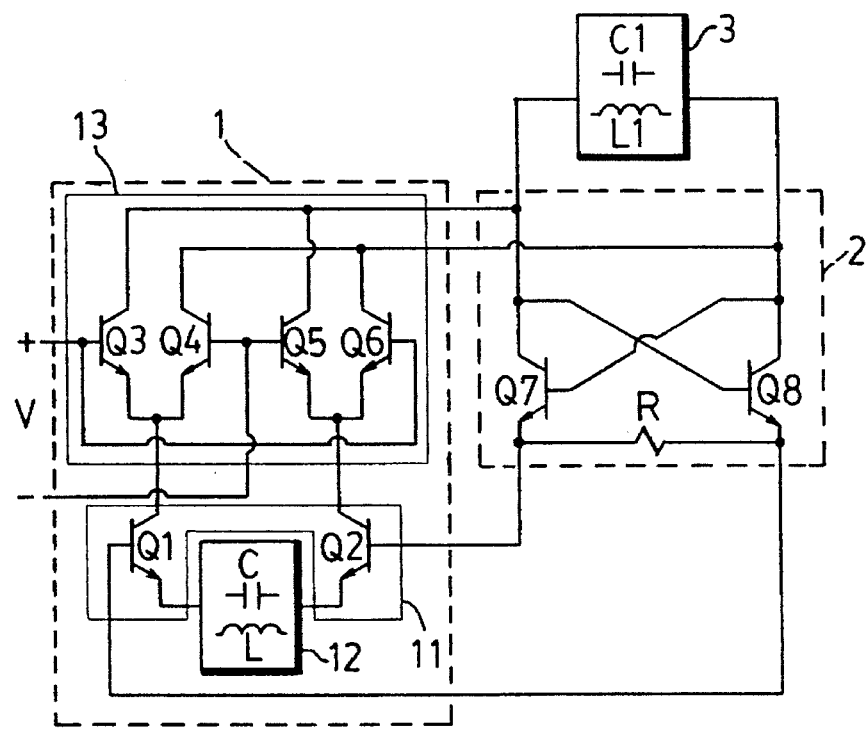
FIG. 2 is a detailed schematic circuit diagram of the first preferred embodiment.

Referring to FIG. 2, the variable impedance circuit 1 comprises a differential circuit 11, a reactive element 12 and a variable current attenuator (or current amplifier) 13.

The differential circuit 11 includes a transistor pair Q1, Q2 with a pair of bases that serve as input terminals, a pair of collectors that serve as output terminals, and a pair of emitters. The reactive element 12 is connected between the emitters of the transistor pair Q1, Q2 and may be a capacitive element C or an inductive element L. The variable current attenuator 13 has a pair of input terminals connected respectively to the output terminals of the transistor pair Q1, Q2, a pair of output terminals, and a pair of control inputs for receiving a control voltage V to vary the current gain of the variable current attenuator 13 to vary correspondingly an impedance measured across the output terminals of the variable current attenuator 13. The control inputs may both be connected to an external control device. Alternatively, one of the control inputs may be connected to a reference voltage node in a known manner.

Preferably, the variable current attenuator 13 comprises first, second, third and fourth transistors Q3, Q4, Q5, Q6. The first and second transistors Q3, Q4 have emitters which are connected together and which serve as a first one of the input terminals of the variable current attenuator 13. The third and fourth transistors Q5, Q6 have emitters which are connected together and which serve as a second one of the input terminals of the variable current attenuator 13. The first and third transistors Q3, Q5 have collectors which are connected together and which serve as a first one of the output terminals of the variable current attenuator 13. The second and fourth transistors Q4, Q6 have collectors which are connected together and which serve as a second one of the output terminals of the variable current attenuator 13. The first and fourth transistors Q3, Q6 have bases which are connected together and which serve as a first one of the control inputs of the variable current attenuator 13. The second and third transistors Q4, Q5 have bases which are connected together and which serve as a second one of the control inputs of the variable current attenuator 13.

The negative impedance circuit 2 comprises a pair of transistors Q7, Q8 and a resistive load R. The base of the transistor Q7 is connected to the collector of the transistor Q8, while the base of the transistor Q8 is connected to the collector of the transistor Q7. The collectors of the transistors Q7, Q8 serve as an output terminal pair of the negative impedance circuit 2. The resistive load R is connected between the emitters of the transistors Q7, Q8, which serve as an input terminal pair of the negative impedance circuit 2, and is further connected to the input terminals of the transistor pair Q1, Q2 of the differential circuit 11.

The reactive load 3 may be a capacitive load C1 or an inductive load L1, and is connected to the collectors of the transistors Q7, Q8 and to the output terminals of the variable current attenuator 13.

The operation of the first preferred embodiment is described as follows:

The impedance Znew measured across the output terminals of the variable current attenuator 13 is given as follows:

$$Znew=Z[1+2e^{-V/VT}+e^{-2(V/VT)}]/[1-e^{-2(V/VT)}]$$

wherein Z is the impedance of the reactive element 12, V is the control voltage, and VT is the thermal voltage.

If the reactive element 12 is an inductive element L, the reactive load 3 should be a capacitive load C1. The oscillating frequency fosc is given as follows:

$$fosc=(2\pi)^{-1}[Znew*C1]^{-\frac{1}{2}}$$

If the reactive element 12 is a capacitive element C, the reactive load 3 should be an inductive load L1. The oscillating frequency fosc is given as follows:

$$fosc=(2\pi)^{-1}[Znew*L1]^{-\frac{1}{2}}$$

Thus, when the control voltage V is varied to vary the impedance Znew of the variable impedance circuit 1, the oscillating frequency fosc is correspondingly varied.

In the first preferred embodiment, the oscillating output signal is measured across the resistive load R. The negative impedance circuit 2 not only serves as a positive feedback path for the variable impedance circuit 1, but also serves as a level shifter, by means of the base-emitter junctions of the transistors Q7, Q8, for shifting the DC level of the signal across the bases of the transistors Q7, Q8 before feeding the same to the variable impedance circuit 1.

Figure 3:
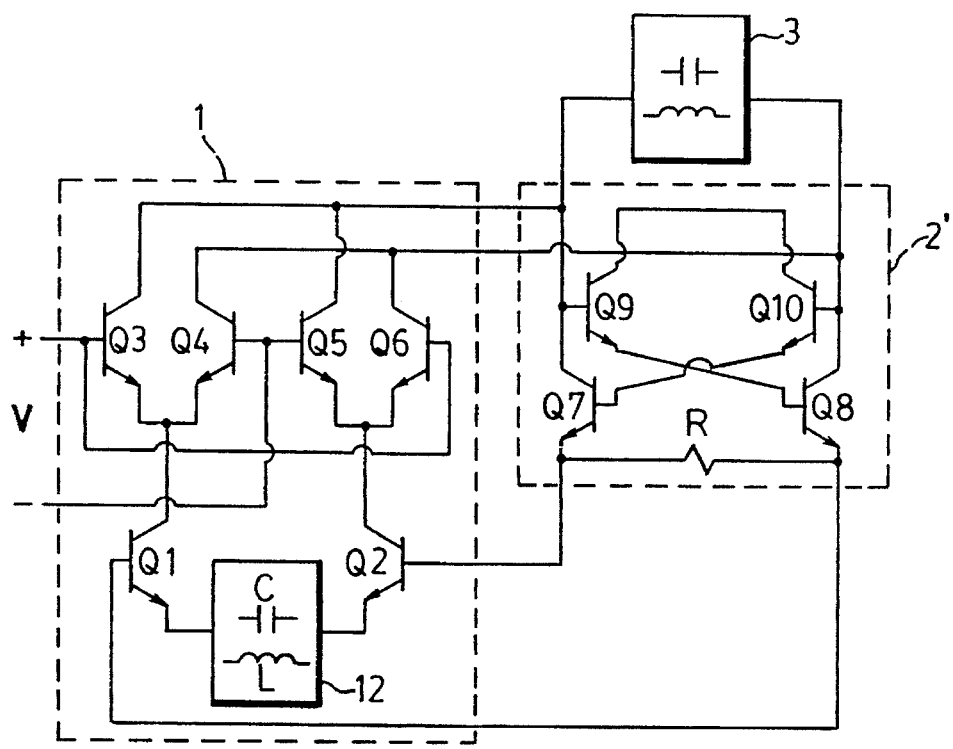
FIG. 3 is a detailed schematic circuit diagram of the second preferred embodiment of a variable frequency oscillator according to the present invention.

FIG. 3 illustrates the second preferred embodiment of a variable frequency oscillator according to the present invention. The second preferred embodiment is substantially similar to the first preferred embodiment, except that the negative impedance circuit 2' of the second preferred embodiment further comprises a pair of transistors Q9, Q10. The base of the transistor Q7 is connected to the emitter of the transistor Q10, while the base of the transistor Q10 is connected to the collector of the transistor Q8. The base of the transistor Q8 is connected to the emitter of the transistor Q9, while the base of the transistor Q9 is connected to the collector of the transistor Q7. The collectors of the transistors Q9, Q10 are connected to one another. In this embodiment, the base-emitter junctions of the transistors Q9, Q10 also have a level shifting function similar to that performed by the base-emitter junctions of the transistors Q7, Q8. As with the previous embodiment, the oscillating output signal can be measured across the resistive load R. Alternatively, the oscillating output signal can also be measured across the bases of the transistors Q7, Q8 to reduce the effects of loading.

Figure 4:
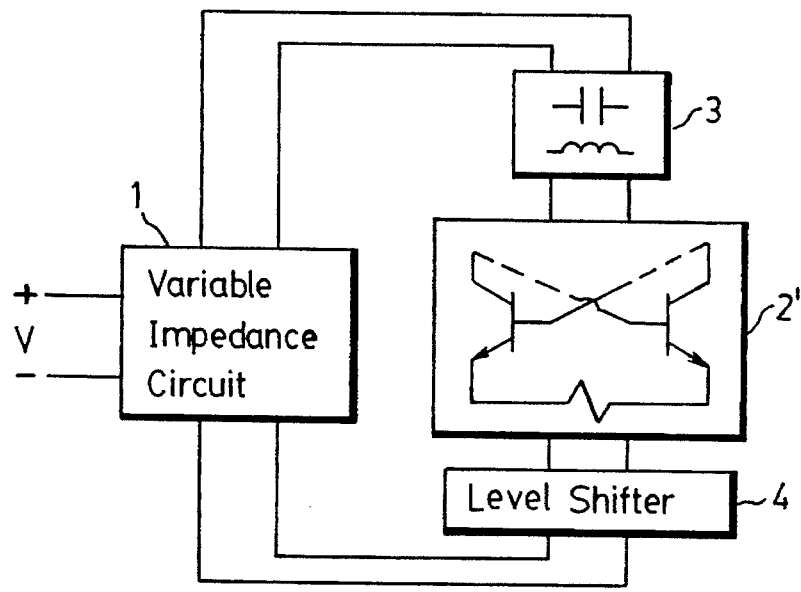
FIG. 4 is a schematic circuit block diagram of the third preferred embodiment of a variable frequency oscillator according to the present invention.
Figure 5:
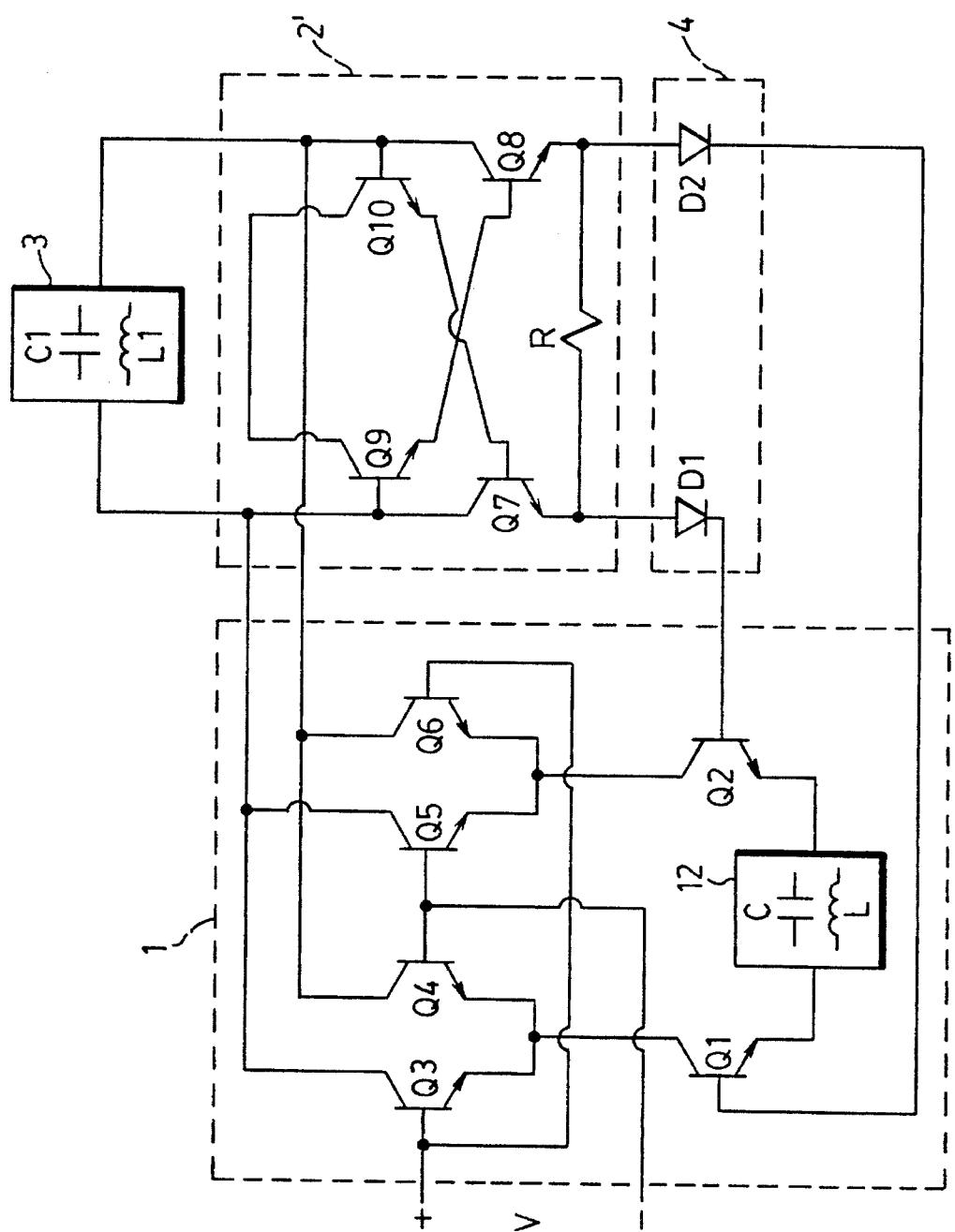
FIG. 5 is a detailed schematic circuit diagram of the third preferred embodiment.

FIGS. 4 and 5 illustrate the third preferred embodiment of a variable frequency oscillator according to the present invention. The third preferred embodiment is substantially similar to the second preferred embodiment, except that the latter further comprises a level shifter 4. In this embodiment, the level shifter 4 includes a pair of diodes D1, D2 which connect respectively the negative impedance circuit 2' to the input terminals of the transistor pair Q1, Q2. The diodes D1, D2 serve to shift further the level of the output terminal pair of the negative impedance circuit 2' of the second preferred embodiment.

Figure 6:
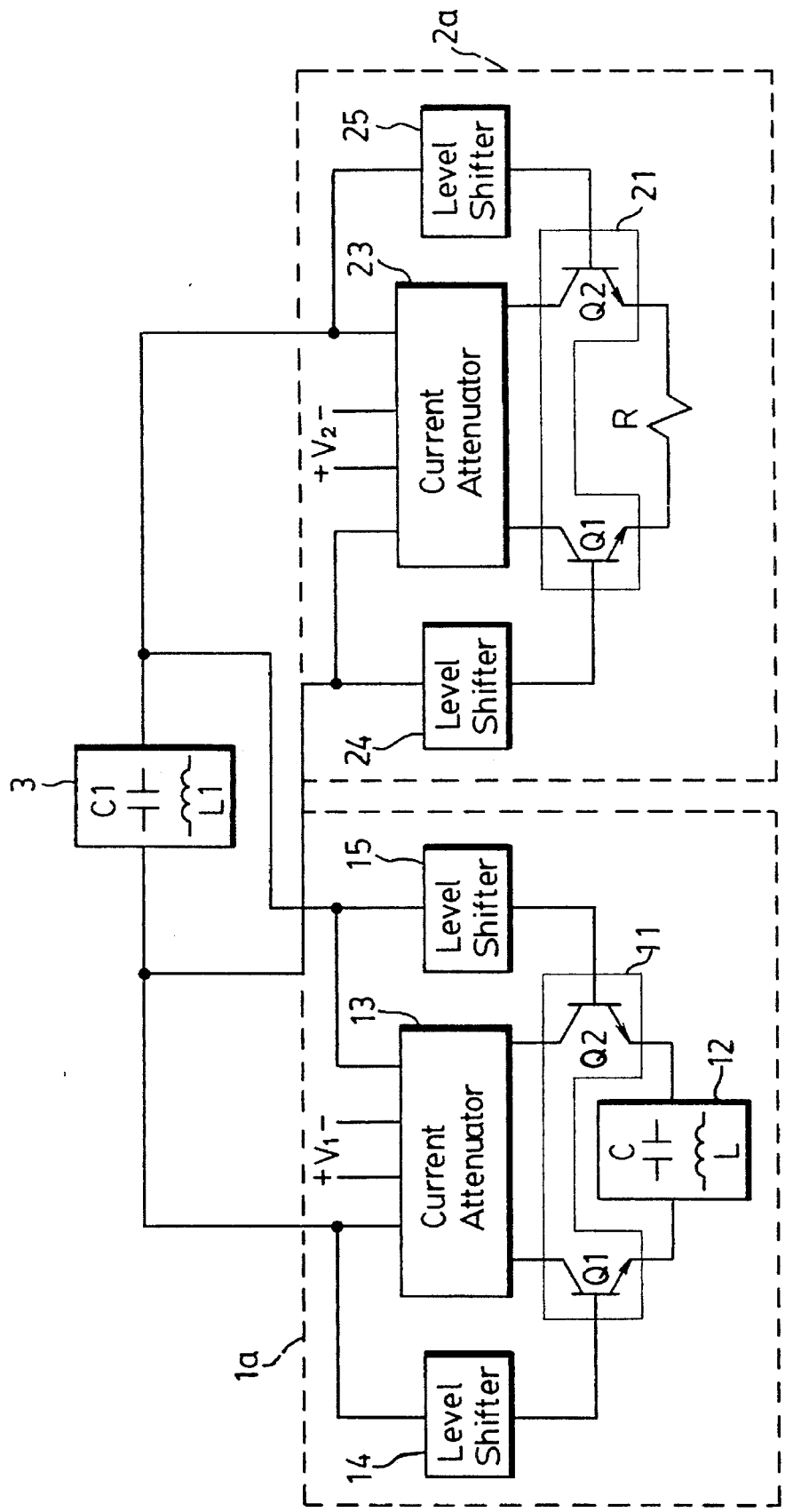
FIG. 6 is a schematic circuit block diagram of the fourth preferred embodiment of a variable frequency oscillator according to the present invention.

FIG. 6 illustrates the fourth preferred embodiment of a variable frequency oscillator according to the present invention. The fourth preferred embodiment similarly comprises a variable impedance circuit 1a, a negative impedance circuit 2a, and a reactive load 3.

The variable impedance circuit 1a is similar in construction to the variable impedance 1 of the previous embodiments and also comprises a differential circuit 11, a reactive element 12 and a variable current attenuator (or current amplifier) 13.

The differential circuit 11 includes a transistor pair Q1, Q2 with a pair of bases that serve as input terminals, a pair of collectors that serve as output terminals, and a pair of emitters. The reactive element 12 is connected between the emitters of the transistor pair Q1, Q2 and may be a capacitive element C or an inductive element L. The variable current attenuator 13 has a pair of input terminals connected respectively to the output terminals of the transistor pair Q1, Q2, a pair of output terminals, and a pair of control inputs for receiving a control voltage V1 to vary the current gain of the variable current attenuator 13 to vary correspondingly an impedance measured across the output terminals of the variable current attenuator 13.

The variable impedance circuit 1a further comprises a pair of level shifters 14, 15, each of which has an input terminal connected to a respective one of the output terminals of the variable current attenuator and an output terminal connected to a respective one of the input terminals of the transistor pair Q1, Q2. The level shifters 14, 15 may include at least one diode or at least one transistor. The level shifters 14, 15 ensure that the differential circuit 11 and the variable current attenuator 13 are properly biased at forward active regions.

The negative impedance circuit 2a is substantially similar to the variable impedance circuit 1a in construction and comprises a differential circuit 21, a variable current attenuator (or current amplifier) 23 and a pair of level shifters 24, 25.

The differential circuit 21 includes a transistor pair Q1, Q2 with a pair of bases that serve as input terminals, a pair of collectors that serve as output terminals, and a pair of emitters. A resistive load R is connected between the emitters of the transistor pair Q1, Q2. The variable current attenuator 23 has a pair of input terminals connected respectively to the output terminals of the transistor pair Q1, Q2, a pair of output terminals, and a pair of control inputs for receiving a control voltage V2 to vary the impedance of the negative impedance circuit 2a. Each of the level shifters 24, 25 has an input terminal connected to a respective one of the output terminals of the variable current attenuator 23, and an output terminal connected to a respective one of the input terminals of the transistor pair Q1, Q2 of the differential circuit 21.

The reactive load 3 may be a capacitive load C1 or an inductive load L1, and is connected to the output terminals of the variable current attenuators 13, 23.

Figure 7:
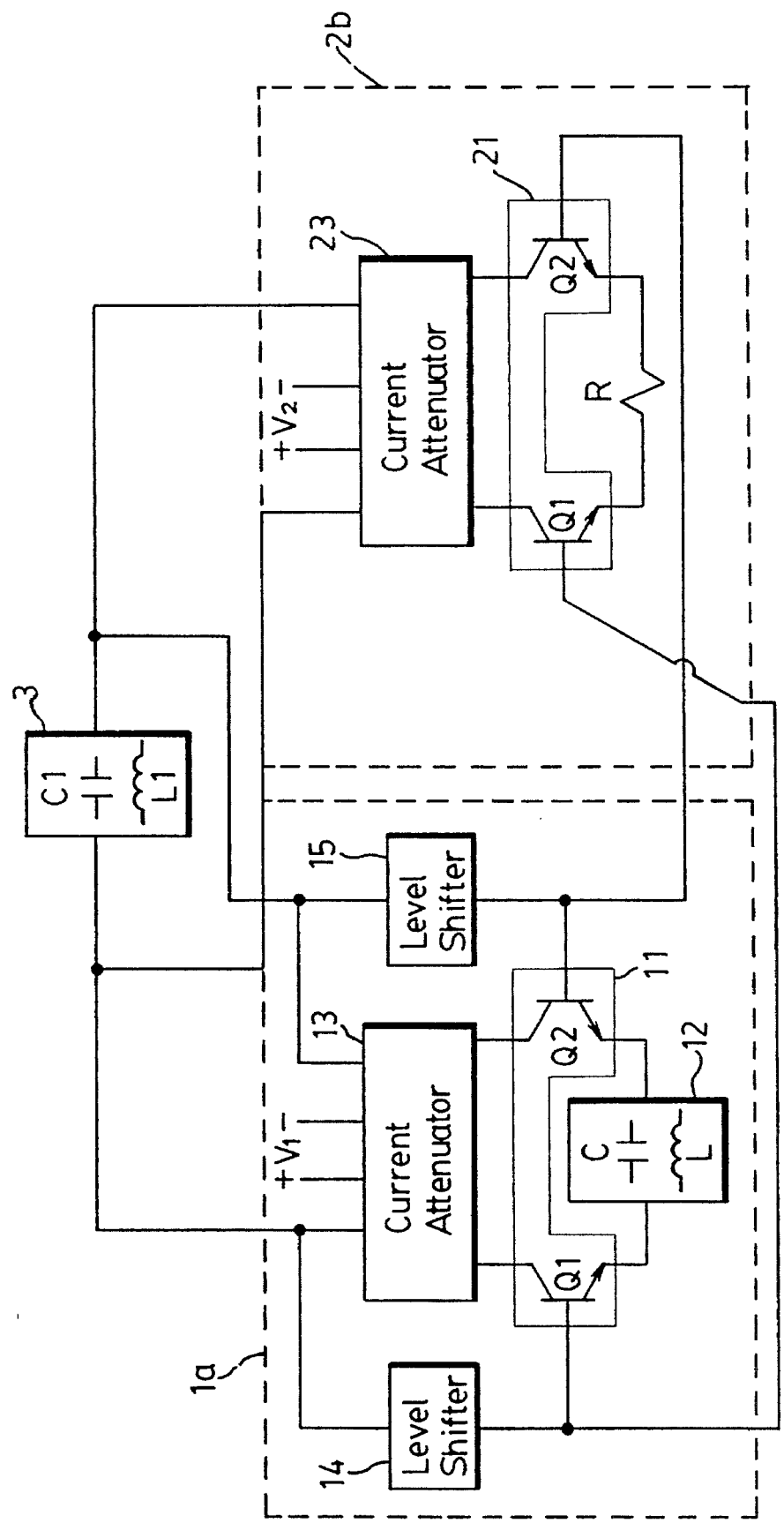
FIG. 7 is a schematic circuit block diagram of the fifth preferred embodiment of a variable frequency oscillator according to the present invention.

FIG. 7 illustrates the fifth preferred embodiment of a variable frequency oscillator according to the present invention. The fifth preferred embodiment is similar in construction to the fourth preferred embodiment, the main difference residing in the construction of the negative impedance circuit 2b.

The negative impedance circuit 2b comprises a differential circuit 21 and a variable current attenuator (or current amplifier) 23. The differential circuit 21 includes a transistor pair Q1, Q2 with a pair of bases that serve as input terminals and that are connected to the input terminals of the differential circuit 11, a pair of collectors that serve as output terminals, and a pair of emitters. A resistive load R is connected between the emitters of the transistor pair Q1, Q2. The variable current attenuator 23 has a pair of input terminals connected respectively to the output terminals of the transistor pair Q1, Q2, a pair of output terminals, and a pair of control inputs for receiving a control voltage V2 to vary the impedance of the negative impedance circuit 2b. The reactive load 3 is connected to the output terminals of the variable current attenuators 13, 23.

Since the variable frequency oscillator of the present invention is of a tuned oscillator-type, it is operable and stable at high frequencies and has relatively low phase noise. Frequency adjustment within a relatively broad range is possible due to the use of a variable impedance circuit. In addition, no expensive and bulky external circuitry, such as varactors, are required, and the various transistors employed in the present invention may be implemented as BJT transistors or as MOSFET transistors, thereby permitting the implementation of the variable frequency oscillator of this invention in semiconductor chips as monolithic integrated circuits.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A variable frequency oscillator, comprising:

a variable impedance circuit having an input terminal pair, an output terminal pair and a control input pair for receiving a control voltage to vary impedance of said variable impedance circuit;

a reactive load connected to said output terminal pair of said variable impedance circuit, said variable impedance circuit being a capacitive impedance when said reactive load is an inductive load and being an inductive impedance when said reactive load is a capacitive load; and a negative impedance circuit having an output terminal pair connected to said output terminal pair of said variable impedance circuit and an input terminal pair connected to said input terminal pair of said variable impedance circuit, said negative impedance circuit serving as a positive feedback path for said variable impedance circuit.

2. The variable frequency oscillator as claimed in claim 1, wherein said negative impedance circuit comprises a pair of first transistors with a pair of collectors that serve as said output terminal pair of said negative impedance circuit, and a pair of emitters that serve as said input terminal pair of said negative impedance circuit, each of said first transistors further having a base connected to said collector of the other one of said first transistors, said negative impedance circuit further comprising a resistive load connected between said pair of emitters of said first transistor pair.

3. The variable frequency oscillator as claimed in claim 2, wherein said variable impedance circuit comprises:
   a differential circuit including a transistor pair with a pair of input terminals that serve as said input terminal pair of said variable impedance circuit, a pair of output terminals, and a pair of emitters;
   a reactive element connected between said emitters of said transistor pair of said differential circuit, said reactive element being a capacitive element when said reactive load is an inductive load and being an inductive element when said reactive load is a capacitive load; and
   a variable current attenuator having a pair of input terminals connected respectively to said output terminals of said transistor pair of said differential circuit, a pair of output terminals that serve as said output terminal pair of said variable impedance circuit, and said control input pair for receiving the control voltage to vary current gain of said variable current attenuator;
   whereby, varying of said current gain of said variable current attenuator results in varying of an impedance measured across said output terminals of said variable current attenuator.

4. The variable frequency oscillator as claimed in claim 3, wherein said variable current attenuator comprises a first transistor, a second transistor, a third transistor and a fourth transistor, said first and second transistors having emitters which are connected together and which serve as a first one of said input terminals of said variable current attenuator, said third and fourth transistors having emitters which are connected together and which serve as a second one of said input terminals of said variable current attenuator, said first and third transistors having collectors which are connected together and which serve as a first one of said output terminals of said variable current attenuator, said second and fourth transistors having collectors which are connected together and which serve as a second one of said output terminals of said variable current attenuator, said first and fourth transistors having bases which are connected together and which serve as a first one of said control input pair, and said second and third transistors having bases which are connected together and which serve as a second one of said control input pair.

5. The variable frequency oscillator as claimed in claim 4, wherein said transistor pair of said differential circuit has a pair of bases which serve as said input terminals thereof and a pair of collectors which serve as said output terminals thereof.

6. The variable frequency oscillator as claimed in claim 5, wherein said negative impedance circuit further comprises a pair of second transistors, each of which having a base connected to said collector of one of said first transistors of said negative impedance circuit, and an emitter connected to said base of the other one of said first transistors of said negative impedance circuit, said second transistors further having a pair of collectors which are connected to one another.

7. The variable frequency oscillator as claimed in claim 6, further comprising a level shifter interconnecting said input terminal pair of said negative impedance circuit and said input terminal pair of said variable impedance circuit.

8. A variable frequency oscillator, comprising:
   a variable impedance circuit including: a first differential circuit having a transistor pair with a pair of input terminals, a pair of output terminals, and a pair of emitters; a reactive element connected between said emitters of said transistor pair; a first variable current attenuator having a pair of input terminals connected respectively to said output terminals of said transistor pair, a pair of output terminals, and a control input pair for receiving a first control voltage to vary current gain of said first variable current attenuator to vary correspondingly an impedance measured across said output terminals of said first variable current attenuator; and a pair of level shifters, each of which having an input terminal connected to a respective one of said output terminals of said variable current attenuator, and an output terminal connected to a respective one of said input terminals of said transistor pair, said level shifters ensuring that said first differential circuit and said first variable current attenuator are properly biased;
   a reactive load connected to said output terminals of said first variable current attenuator, said reactive element being a capacitive element when said reactive load is an inductive load and being an inductive element when said reactive load is a capacitive load; and
   a negative impedance circuit having an output terminal pair connected to said output terminals of said first variable current attenuator.

9. The variable frequency oscillator as claimed in claim 8, wherein said negative impedance circuit comprises:
   a second differential circuit having a transistor pair with a pair of input terminals, a pair of output terminals, and a pair of emitters;
   a resistive element connected between said emitters of said transistor pair of said second differential circuit;
   a second variable current attenuator having a pair of input terminals connected respectively to said output terminals of said transistor pair of said second differential circuit, a pair of output terminals serving as said output terminal pair of said negative impedance circuit, and a control input pair for receiving a second control voltage to vary impedance of said negative impedance circuit; and
   a pair of level shifters, each of which having an input terminal connected to a respective one of said output terminals of said second variable current attenuator, and an output terminal connected to a respective one of said input terminals of said transistor pair of said second differential circuit.

10. The variable frequency oscillator as claimed in claim 9, wherein each of said first and second variable current attenuators comprises a first transistor, a second transistor, a third transistor and a fourth transistor, said first and second transistors having emitters which are connected together and which serve as a first one of said input terminals of said variable current attenuator, said third and fourth transistors having emitters which are connected together and which serve as a second one of said input terminals of said variable current attenuator, said first and third transistors having collectors which are connected together and which serve as a first one of said output terminals of said variable current attenuator, said second and fourth transistors having collectors which are connected together and which serve as a second one of said output terminals of said variable current attenuator, said first and fourth transistors having bases which are connected together and which serve as a first one of said control input pair, and said second and third transistors having bases which are connected together and which serve as a second one of said control input pair.

11. The variable frequency oscillator as claimed in claim 10, wherein said transistor pair of each of said first and second differential circuits has a pair of bases which serve as said input terminals thereof and a pair of collectors which serve as said output terminals thereof.

12. The variable frequency oscillator as claimed in claim 8, wherein said negative impedance circuit further has an input terminal pair connected to said input terminals of said first differential circuit.

13. The variable frequency oscillator as claimed in claim 12, wherein said negative impedance circuit comprises:

a second differential circuit having a transistor pair with a pair of input terminals connected to said input terminals of said transistor pair of said first differential circuit, a pair of output terminals, and a pair of emitters;

a resistive element connected between said emitters of said transistor pair of said second differential circuit; and a second variable current attenuator having a pair of input terminals connected respectively to said output terminals of said transistor pair of said second differential circuit, a pair of output terminals serving as said output terminal pair of said negative impedance circuit, and a control input pair for receiving a second control voltage to vary impedance of said negative impedance circuit.

14. The variable frequency oscillator as claimed in claim 13, wherein each of said first and second variable current attenuators comprises a first transistor, a second transistor, a third transistor and a fourth transistor, said first and second transistors having emitters which are connected together and which serve as a first one of said input terminals of said variable current attenuator, said third and fourth transistors having emitters which are connected together and which serve as a second one of said input terminals of said variable current attenuator, said first and third transistors having collectors which are connected together and which serve as a first one of said output terminals of said variable current attenuator, said second and fourth transistors having collectors which are connected together and which serve as a second one of said output terminals of said variable current attenuator, said first and fourth transistors having bases which are connected together and which serve as a first one of said control input pair, and said second and third transistors having bases which are connected together and which serve as a second one of said control input pair.

15. The variable frequency oscillator as claimed in claim 14, wherein said transistor pair of each of said first and second differential circuits has a pair of bases which serve as said input terminals thereof and a pair of collectors which serve as said output terminals thereof.

* * * * *